(12) United States Patent
Biyani et al.

(10) Patent No.: US 7,796,445 B1
(45) Date of Patent: Sep. 14, 2010

(54) STATE-RETENTIVE SCAN LATCH (75) Inventors: Manish Biyani, Chandler, AZ (US);
Franco Ricci, Chandler, AZ (US)

(73) Assignee: Marvell International, Ltd., Hamilton (BM)

( * ) Notice: Subject to any disclaimer, the term of this patent is extended or adjusted under 35 U.S.C. 154(b) by 304 days.

(21) Appl. No.: 12/029,908

(22) Filed: Feb. 12, 2008

Related U.S. Application Data (60) Provisional application No. 60/889,452, filed on Feb. 12, 2007.

(51) Int. Cl.
*G11C 7/00* (2006.01)

(52) U.S. Cl. .......................... 365/189.05; 365/185.08; 365/154

(58) Field of Classification Search .................. 365/156
See application file for complete search history.

(56) References Cited

U.S. PATENT DOCUMENTS 6,532,169 B1 *   3/2003   Mann et al. ............ 365/185.08
6,775,180 B2     8/2004   Biyani et al.

* cited by examiner

*Primary Examiner*—Tan T. Nguyen (57) ABSTRACT

A device can include 1) a sustained or constantly powered low leakage latch to and from which a volatile state is uploaded and downloaded, respectively, based on an active-to-low signal, and 2) an intermittently powered or de-powerable memory element, coupled to the low leakage latch, from which and to which the volatile state is uploaded and downloaded, respectively, based on the active-to-low signal and a de-powerable voltage across the de-powerable memory element is powered and un-powered, respectively.

23 Claims, 5 Drawing Sheets

STATE-RETENTIVE SCAN LATCH

INCORPORATION BY REFERENCE

This application claims the benefit of U.S. Provisional Application No. 60/889,452, "State Retention using LSSD Scan Latch to Reduce Standby Leakage Current" filed on Feb. 12, 2007, including all cited references which are incorporated herein by reference in their entirety.

BACKGROUND

A latch is a bi-stable or two-state electronic memory element in which the state of the memory is determined by a level of an input signal. A latch does not require a clock signal to capture the state of the input signal. A latch can be constructed of transistors, such as metal oxide semiconductor field effect transistors (MOSFETs), junction field effect transistors (JFETs), bipolar junction transistors (BJTs), and the like.

In contrast, a flip-flop is an electronic memory storage element in which a state is stored when a clock signal is asserted. A flip-flop is a synchronous or clocked memory element that can be triggered by either an edge or a level of the clock signal. Edge-triggered or edge-clocked flip-flops are commonly used as the memories or state elements in sequential logic circuits.

SUMMARY

In a scan design, the state elements of an integrated circuit (IC) can be serially connected or daisy-chained to form a shift register called a scan chain. A scan chain can sequentially scan or test the daisy-chained state elements of the IC. The IC may have more than one scan chain.

A serial test pattern can stimulate the scan chain and the resulting state of state elements that are included in the scan chain can be read out or transmitted from the IC. Each scan chain can be driven at a stimulus point and measured at an observation point. There are various methods for driving or injecting test signals into each scan chain and extracting or measuring responses from the scan chain state elements.

A level-sensitive scan design (LSSD) circuit can include a pulse data input, a pulse clock input, a pulse state output, a serial data input, a shift-enable input, and a serial data output. An LSSD can function as a standard D-type flip-flop when the shift-enable level is not asserted and can act as a master-slave flip-flop when a data clock signal is not asserted. The shift enable signal is not asserted when the LSSD is in a normal mode as opposed to a scanning or scan mode.

The shift-enable signal can be described as a level-triggered serial clock signal. When the shift-enable signal is present or the IC is in the scan mode, the serial data input can appear at the serial data output of the LSSD, however, the serial scan data may be stored in a de-powerable memory element first. When shifting data through the LSSD, the shift-enable signal can be asserted so the IC is in the scan mode. During the scan mode, the pulse data and pulse clock inputs can be held low so the LSSD can be loaded via the serial data input.

Aspects of this disclosure can provide a device that can include 1) a sustained or constantly powered low leakage latch to and from which a volatile state is uploaded and downloaded, respectively, based on an active-to-low signal, and 2) an intermittently powered or de-powerable memory element, coupled to the low leakage latch, from which and to which the volatile state is uploaded and downloaded, respectively, based on the active-to-low signal and a de-powerable voltage across the de-powerable memory element is powered and un-powered, respectively.

The device can further include a scan input circuit that transfers serial scan data to the de-powerable memory element when a scan clock signal is asserted.

Additionally, the device can include a bi-directional pass gate that can transfer the volatile state between the de-powerable memory element and the low leakage latch when the transfer signal is asserted. The transfer signal can be asserted when either a standby mode signal is asserted or when another, non-overlapping scan clock signal is asserted. The scan clock signal can be de-asserted before the non-overlapping scan clock is asserted.

The scan input circuit can transfer the serial scan data to the de-powerable memory element first then transfer the serial scan data to the low leakage latch.

The low leakage latch of the disclosed device can further include a feed-forward low leakage inverter and a feedback low leakage inverter coupled to the feed-forward low leakage inverter. The output of the feedback low leakage inverter can connect to an input of the feed-forward low leakage inverter and an input of the feedback low leakage inverter can connect to an output of the feed-forward low leakage inverter. In other words, the feed-forward low leakage inverter and the feedback low leakage inverter can form a ring.

The feed-forward low leakage inverter, the feedback low leakage inverter, and the bi-directional pass gate can each further include thick gate oxide MOSFET transistors. The thick gate oxide MOSFET transistors can reduce the leakage current drawn from a power supply.

The bi-directional pass gate can further include 1) a pass transistor coupled to the output of the feedback low leakage inverter and the input of the feed-forward low leakage inverter, and 2) a pass transistor coupled to the input of the feedback low leakage inverter and the output of the feed-forward low leakage inverter. The pass transistors can implement switchable impedance paths that couple or decouple the de-powerable memory element and the low leakage latch.

In a further aspect of the disclosed device, the device can include a serial inverter that can output a state of the low leakage latch. The low leakage latch state can hold the state of the serial scan data or a volatile state and the inverter can complement the low leakage latch state.

The sustained voltage of the device can have more than one voltage level substantially excluding zero Volts. For example, the sustained voltage can lie in a range of 5 Volts, inclusive, to zero Volts, non-inclusive. Some levels of the sustained voltage can be advantageously chosen to reduce power consumption in a standby mode relative to the power consumption in the standby mode when only a single sustained voltage level is used. When the de-powerable voltage is zeroed, the sustained voltage can be advantageously chosen to be a lower voltage from a group of non-zero voltage levels. For example, the sustained voltage can be reduced from 3.3 Volts to 1.8 Volts or from 1.8 Volts to 1.1 Volts.

The disclosed device can further include a transfer gate that can transfer a clocked data signal to the de-powerable memory element after 1) a pulse clock signal is asserted, and 2) the de-powerable voltage is set to a non-zero value so the de-powerable memory element becomes active. The transfer gate can block the transfer of the clocked data signal when the pulse clock signal is de-asserted.

The de-powerable memory element of the disclosed device can further include a feed-forward inverter and a feedback inverter. The feed-forward and feedback inverters can be coupled such that an output of the feedback inverter is connected to an input of the feed-forward inverter and vice-versa. The feedback inverter can be constructed as a gated inverter that can be gated by the pulse clock signal. Upon assertion of the pulse clock signal, the transfer gate can store the volatile state in the de-powerable memory element.

The present disclosure includes a method that can include uploading a volatile state from a de-powerable memory element to a low leakage latch when both an active-to-low signal is asserted and the de-powerable memory element is powered or active. The volatile state can be downloaded from the low leakage latch to the de-powerable memory element when the active-to-low signal is asserted and the de-powerable memory element is un-powered, then the de-powerable memory element can be powered.

The disclosed method can further include storing serial scan data in the de-powerable memory element when a scan clock signal is asserted.

The transfer signal of the disclosed method can be asserted when either 1) an active-to-low signal is asserted or 2) a second scan clock signal is asserted. The active-to-low signal can initiate a power saving mode and the second scan clock signal can duplicate the serial scan data in a scan mode. In an advantageous case, the scan clock signal can be de-asserted before the second, non-overlapping scan clock is asserted.

Further aspects of the disclosed method can include reducing the voltage level of a sustained voltage in the range of 0 to 5 Volts that powers the low leakage latch. The sustained voltage can be reduced from a voltage in the range of 0 to 5 Volts to a lower voltage in the range of 0 to 5 Volts. Reduction or manipulation of the sustained voltage level can save additional power in a standby mode.

Additional further aspects of the disclosed method can include storing a clocked data signal in the de-powerable memory element when 1) the pulse clock signal is asserted, and 2) the transfer signal is de-asserted.

A method of retaining serial scan data, as discussed in the following detailed description of embodiments, can include 1) storing the serial scan data in a volatile location, thus forming a volatile state, when a scan clock is asserted, then 2) de-asserting the scan clock, 3) storing the volatile state in a nonvolatile location upon assertion of a second scan clock, 4) de-powering the volatile location, 5) initializing the de-powered volatile location with the nonvolatile state, and 6) re-powering the volatile location.

Using the information and teaching of the present disclosure a method of retaining clocked data can include: storing the clocked data in a volatile location to form a volatile state upon assertion of pulse clock, storing the volatile state in a nonvolatile location to form a nonvolatile state when a transfer signal is asserted, then de-powering the volatile location.

BRIEF DESCRIPTION OF THE DRAWINGS

This disclosure will make reference to the accompanying figures, wherein like numerals represent like elements, and wherein.

DETAILED DESCRIPTION OF EMBODIMENTS

Figure 1:
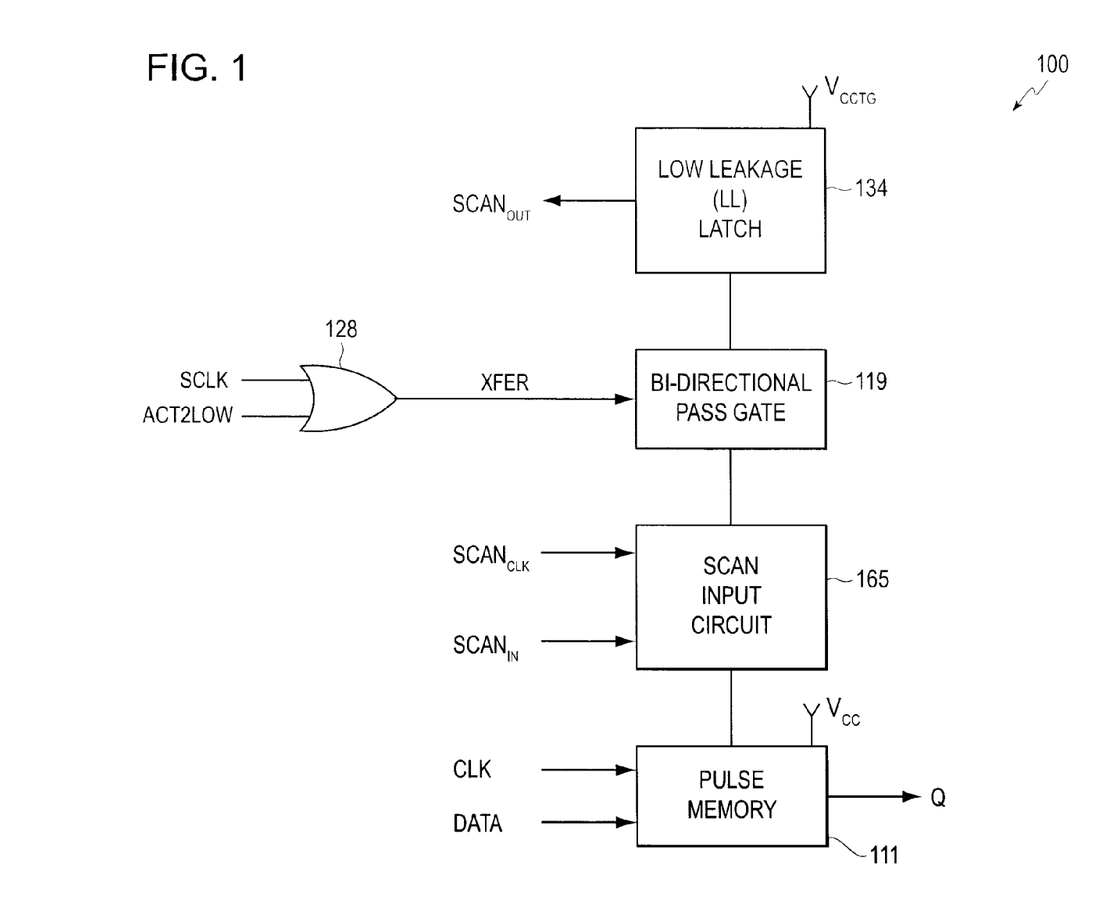
FIG. 1 is a drawing of an exemplary state retentive scan latch.

FIG. 1 shows a diagram of an exemplary state retentive scan latch 100 including a master flip-flop or pulse memory 111, a slave or low leakage (LL) latch 134, a scan input circuit 165, a logic gate 128, and a pass gate or bi-directional pass gate 119. The logic gate 128 may be coupled to the bi-directional pass gate 119. The pulse memory 111, low leakage (LL) latch 134, scan input circuit 165, and bi-directional pass gate 119 can be coupled via one or more bi-directional lines. The pulse memory 111, LL latch 134, scan input circuit 165, and bi-directional pass gate 119 may be arranged in series so that the pulse memory 111 may be coupled to the scan input circuit 165, the scan input circuit 165 may be coupled to the bi-directional pass gate 119, and the bi-directional pass gate 119 may be coupled to the LL latch 134. In one configuration, the pulse memory 111 can be coupled to the LL latch 134 through the bi-directional pass gate 119, while the scan input circuit 165 can inject scan data onto the transfer lines.

As an example, the pulse memory 111 may include storage inverters coupled in a unidirectional ring configuration to store data. In this example, the pulse memory 111 can also include a transmission gate that can inject a data signal, denoted DATA, into a node of a ring-coupled storage inverter pair. The ring-coupled pair of inverters can form a latch that, when augmented by a transmission gate, function as an equivalent of a flip-flop. The pulse memory 111 can also include an output inverter that inverts the signal from a ring-coupled storage inverter. Either the output inverter or a non-inverting boost amplifier or driver, can boost the current or drive level of a memory output, denoted Q, from the pulse memory 111 that drives external lines or interconnection lines in the IC.

As an example, the LL latch 134 may include storage inverters coupled in a unidirectional ring configuration to store data. The LL latch 134 can also include an output inverter that inverts the signal from a ring-coupled storage inverter. The output inverter or a non-inverting boost amplifier or driver, can boost the current or drive level of a $SCAN_{OUT}$ signal from the LL latch 134 that can drive either external lines or interfaces or interconnection lines in the IC.

In an advantageous example, the LL latch 134, including any storage and/or output inverters, and the bi-directional pass gate 119 may be constructed of low leakage transistors, such as thick gate oxide MOSFETs. The low leakage transistors can save power in a standby mode yet retain sufficient drive capability to initialize a memory element made of non-low leakage or high performance (HP) transistors during power-up or when exiting the standby mode. The thickness of the gate oxide of a thick gate oxide MOSFET transistor is relatively thicker than the gate oxide thickness of a high performance or thin gate oxide MOSFET transistor.

The operation of state retentive scan latch 100 may be described best by listing the modes and timing of data transfer and storage. The modes of the state retentive scan latch 100 may be described as: 1) a normal operational mode, 2) a scan mode, and 3) a standby mode. The timing of data transfer and storage may best be described with respect to transitions between the modes. The particular advantages of the presently disclosed devices and methods can accrue during the standby mode and when entering or exiting the standby mode.

In the normal operational mode of state retentive scan latch 100, a data value, denoted DATA, can be supplied to the pulse memory 111 by either an external circuit or a circuit internal to the IC. The DATA input may be described as a clocked data signal. The pulse memory 111 can also receive a pulse clock or a storage clock input denoted CLK that stores the DATA in a memory element. The pulse memory 111 can be described as a de-powerable memory element and can be connected to a de-powerable voltage, $V_{CC}$. The pulse memory 111 can output a binary state or memory output Q to other sequential logic circuits in an integrated circuit (IC) or to an external circuit.

In the scan mode of state retentive scan latch 100, the scan input circuit 165 can receive a serial data input, denoted $SCAN_{IN}$, and a level-sensitive shift-enable input signal, denoted $SCAN_{CLK}$. The scan input circuit 165 can couple the $SCAN_{IN}$ signal to both the pulse memory 111 and, through the bi-directional pass gate 119, the LL latch 134.

During the scan mode, the bi-directional pass gate 119 can receive a transfer signal, denoted XFER from logic gate 128, that can couple signals to and from the LL latch 134 and the pulse memory 111 through the bi-directional pass gate 119 and scan input circuit 165. The logic gate 128 can generate the XFER signal by logically combining standby mode signal, denoted ACT2LOW, and a clock signal, denoted SCLK.

The bi-directional pass gate 119 can have a high impedance mode and a low impedance mode as determined by the XFER signal. The bi-directional pass gate 119 can transfer a volatile state from the pulse memory 111 to the LL latch 134 when both the LL latch 134 and the pulse memory 111 are active or powered-on and the XFER signal reduces the impedance of the bi-directional pass gate 119. The volatile state can be a state of a master flip-flop, such as pulse memory 111, that can be lost when a core logic power supply, such as $V_{CC}$, is de-powered, un-powered, or zeroed during a standby mode.

When entering the standby mode, a state can be transferred from the pulse memory 111 to the LL latch 134. The state transfer can be referred to as an upload. An upload can be distinguished from a write-back or download, in which data can be transferred from the LL latch 134 to the pulse memory 111. In other words, an upload can retain the state of the pulse memory 111 in the LL latch 134 and a download can write-back to the pulse memory 111 from the LL latch 134. The LL latch 134 can serve as a nonvolatile memory that is powered by a sustained, but not necessarily constant, voltage.

When exiting the standby mode of state retentive scan latch 100, the pulse memory 111 is de-powered and the LL latch 134 is powered by a sustained voltage. During the exit-standby sequence, the XFER signal can transfer data from the LL latch 134 through the bi-directional pass gate 119 to initialize the de-powered pulse memory 111. The state of pulse memory 111 can be restored or written-back with the state of the LL latch 134 when power is restored. In other words, the pulse memory 111 can be initialized by the state transferred from LL latch 134 when exiting the standby mode.

Figure 2:
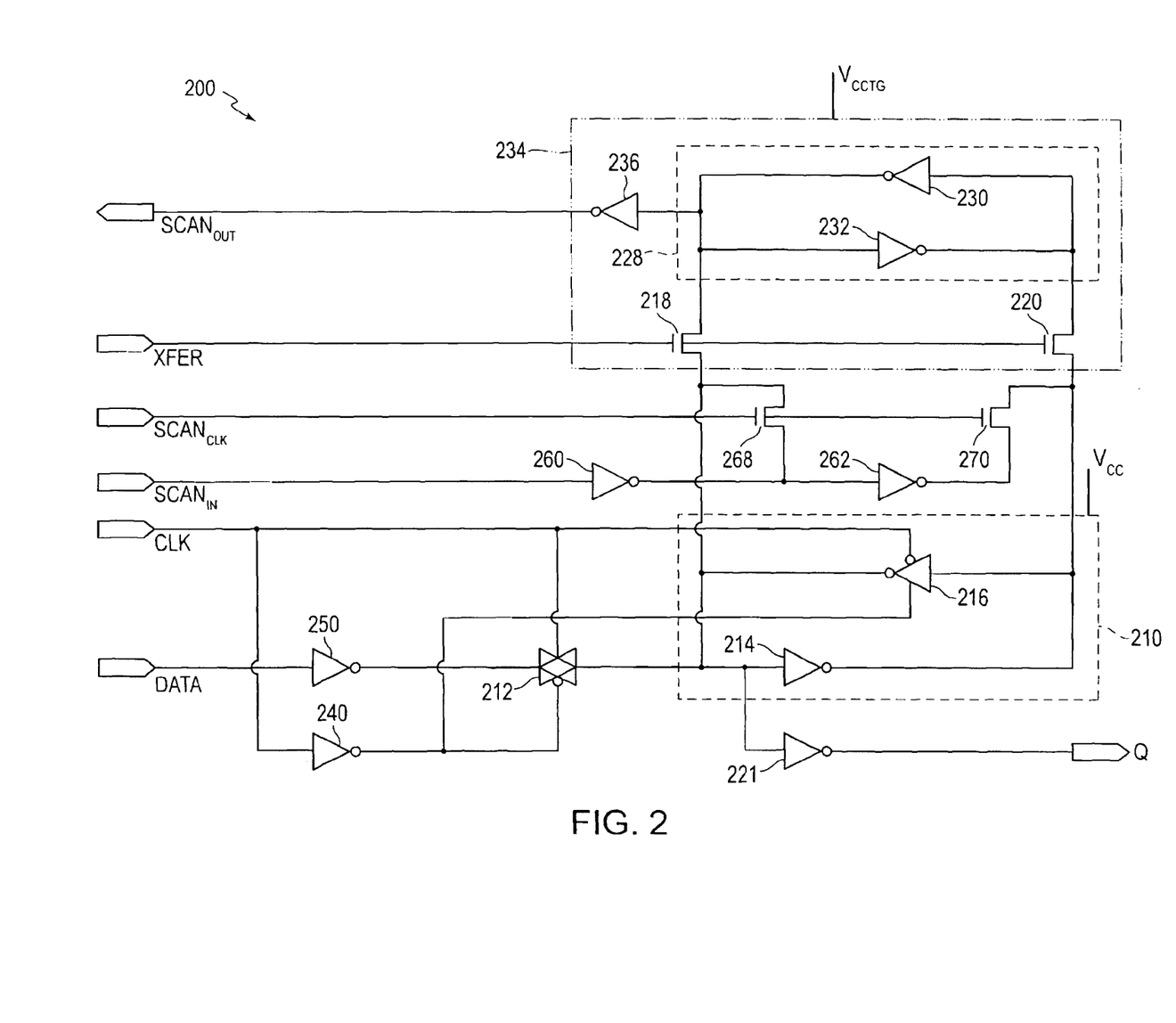
FIG. 2 is a drawing of an exemplary state-retentive scan latch.

FIG. 2 is a diagram of an exemplary state-retentive scan latch 200 including a high performance (HP) memory 210, a low leakage (LL) latch 228, a data inverter 250, a clocked inverter 240, a transmission gate 212, a normal mode inverter 221, a serial input inverter 260, a serial input inverter 262, a pull-down transistor 268, and a pull-down transistor 270.

The HP memory 210 can include a feed-forward HP inverter 214 and a feedback clocked HP inverter 216. The LL latch 228 can include a feed-forward LL inverter 232 and a feedback LL inverter 230. A scan output inverter 236 can invert the output of LL latch 228. The LL latch 228, the scan output inverter 236, the pass transistor 218 and pass transistor 220 can be elements of a thick gate circuit 234.

The thick gate circuit 234 can be a section of circuitry in which transistors are supplied with a thick gate oxide. A thick gate oxide can increase the threshold voltage of metal oxide semiconductor (MOS) transistors. The thick gate oxide may also decrease the transconductance and the drive current of the MOS transistors at a given gate voltage. Other circuit elements of state-retentive scan latch 200 can be constructed using thin gate oxide transistors. Thin gate oxide transistors can have a lower threshold voltage and can have higher performance, including higher transconductance and higher drive current for a given gate voltage. High performance, thin gate transistors can be used to construct the feed-forward HP inverter 214 and the feedback clock HP inverter 216. High performance transistors may require more current than low power, thick gate oxide transistors. High performance transistors can operate at higher speeds and, due to reduced threshold voltages and higher transconductances, can drive larger currents than thick gate oxide transistors.

When a thin gate oxide transistor drives a node in common with a thick gate oxide transistor, the voltage level of the node can match the state of the thin gate oxide transistor.

When a thick gate oxide transistor drives a node in common with a thin gate oxide transistor that is in a standby mode or is un-powered, the node voltage can match the state of the thick gate oxide transistor. A memory element, such as HP memory 210, made of thin gate oxide transistors can be induced to switch to and retain the state of a latch, such as LL latch 228, made of thick gate oxide transistors during a power-up event.

The inverter 250 can receive a data signal, denoted DATA, and can connect the inverted data signal to an input of transmission gate 212. The inverter 240 can receive a clock signal, denoted CLK, and can connect the inverted clock signal to an inverted clock input of transmission gate 212. The CLK can connect to a non-inverted gate of transmission gate 212 and to an inverted clock gate of clocked inverter 216. The inverted clock signal from inverter 214 can control the non-inverted clock input of clocked inverter 216. A second terminal of transmission gate 212 can connect to inverter 214, inverter 221, a drain of pull-down transistor 268 and a source of pass transistor 218. The clocked inverter 216 can supply a signal to the drain of pull-down transistor 268, pass transistor 218, inverter 214, inverter 221, and transmission gate 212. Clocked inverter 216 can receive a latch output signal from inverter 214. Inverter 214 can connect to a drain of pull-down transistor 270 and a source of pass transistor 220. Inverter 221 can supply a signal denoted Q, which can be a stored scan data value or a DATA value, to sequential logic circuits in the IC.

The inverter 260 can receive a $SCAN_{IN}$ input and can connect an inverted $SCAN_{IN}$ input to inverter 262 into a source of a pull-down transistor 268. The output of inverter 262 can connect to a source of a pull-down transistor 270.

The gates of the pull-down transistors 268 and 270 can be connected in series and driven by a common $SCAN_{CLK}$ signal.

The gates of the pass transistors 218 and 220 can be connected in common and driven by the XFER signal. The source of the pass transistor 218 can connect to an output of the feedback LL inverter 230 and an input of the feed-forward LL inverter 232, and an input to the scan output inverter 236. The source of the pass transistor 220 can connect to an output of the feed-forward LL inverter 232 and an input of the feedback LL inverter 230. The output of the scan output inverter 236 can drive a $SCAN_{OUT}$ signal.

In operation, the state-retentive scan latch 100 can be used for high leakage, high performance semiconductor technologies. Using a state-retentive scan latch 100 that includes low leakage transistors can save standby power.

In the scan mode, two non-overlapping clocks, $SCAN_{CLK}$ and SCLK (not shown), can determine when the scan input data, $SCAN_{IN}$, is stored in the HP memory 210 and when the scan input data is transferred from the HP memory 210 to the LL latch 234, respectively. During scan mode, the non-overlapping clocks, $SCAN_{CLK}$ and SCLK, can act as scan input and output clocks, respectively. In other words, $SCAN_{CLK}$ and SCLK can be alternating clocks that shuttle scan data into and out of a scan latch, respectively.

The XFER clock signal shown in FIG. 2 can be a combination of SCLK and an active mode to low power or standby mode signal, denoted ACT2LOW. The combination can be a logical OR of SCLK and ACT2LOW. The combinational logic that generates XFER can be located outside of the state-retentive scan latch 200.

The XFER signal can transfer HP memory 210 data to LL latch 234 when either 1) entering a standby mode or 2) transferring a serial scan state. For example, the $SCAN_{CLK}$ signal can be asserted first so the scan input data, $SCAN_{IN}$, can be stored in the HP memory 210. Next, the XFER signal can be asserted and the data in the HP memory 210 can be transferred through pass transistors 218 and 220 to the LL latch 234. Data from the LL latch 234 can be immediately transferred to a scan output line, denoted $SCAN_{OUT}$. In other words, XFER can upload or copy data from the HP memory 210 to the LL latch 234.

The scan mode can occur when both the HP memory 210 and the LL latch 228 are both powered. The power supply, denoted $V_{CC}$, of the HP memory 210 can be called the core logic supply or the de-powerable voltage. The power supply of the LL latch 228, denoted $V_{CCTG}$, can be called the always-on supply or the sustained voltage. The sustained voltage can lie above 0 Volts up to and including 5 Volts. The sustained voltage can be adjusted downward or reduced to save additional LL latch 234 power. For example, the sustained voltage can be reduced from 3.3 Volts to 1.8 Volts or from 1.8 Volts to 1.1 Volts. The voltage levels of $V_{CC}$ and $V_{CCTG}$ need not be equal.

The HP memory 210 can upload to the LL latch 228 whenever both circuit sections are powered on. The HP memory 210 can override the LL latch 228 due to the stronger current drive characteristics of the HP memory 210. The LL latch 228 can have sufficient drive capability to charge the nodes of the HP memory 210 when the HP memory 210 is de-powered. The HP memory 210 can accept the state of the charged nodes upon power-up.

Figure 3:
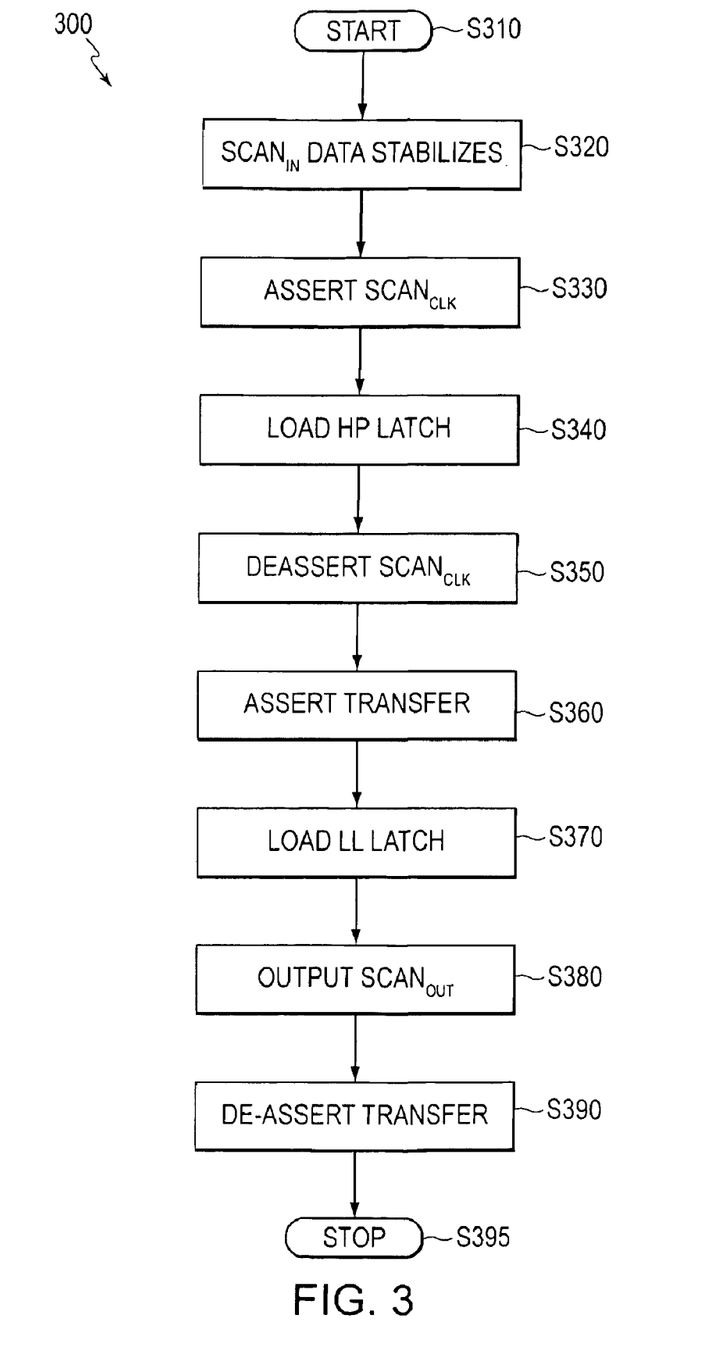
FIG. 3 is a flowchart of an exemplary scan mode of a state-retentive scan latch.

FIG. 3 is a flowchart of an exemplary scan mode of a state-retentive scan latch. Program flow can begin at step S310 and can proceed to step S320 in which serial scan data input, $SCAN_{IN}$, stabilizes. The serial data input can precede a shift-enable signal, denoted $SCAN_{CLK}$, by a setup time that characterizes the semiconductor technology, transistor type, design, and layout characteristics of a latch used in a scan chain. From step S320, program flow can proceed to step S330.

In step S330, the program can assert the $SCAN_{CLK}$ signal and the $SCAN_T$, serial input data can be loaded into a pulse memory or a high performance (HP) memory. From step S330, program flow can proceed to step S340 in which the HP memory is loaded. From step S340, program flow can proceed to step S350 in which the $SCAN_{CLK}$ signal can be de-asserted.

From step S350, program flow can proceed to step S360 in which a transfer command can be asserted. The transfer command can be denoted XFER. The XFER command can enable a transfer gate that transfers a copy of serial data, which has been loaded into a pulse memory or an HP memory, into a state retention latch. The state retention latch can be a low leakage (LL) latch. The LL latch can be constructed of MOSFET transistors with a thick gate oxide, for example. A thick gate oxide can significantly reduce current leakage and reduce power consumption in a standby mode of an integrated circuit (IC).

From step S360, program flow can proceed to step S370 in which the state of a pulse memory or an HP memory can be copied to an LL latch, i.e., the LL latch can be loaded with the state of a pulse or HP memory. From step S370, program flow can proceed to step S380 in which the freshly copied or transferred state data can be presented on a serial data output, denoted $SCAN_{OUT}$. The transferred state data can be inverted or non-inverted when presented on $SCAN_{OUT}$. In other words, the polarity of $SCAN_{OUT}$ can be pre-determined by the design of the scan chain elements.

From step S380, program flow can proceed to step S390 in which the XFER signal can be de-asserted. The transfer of state from an HP memory to an LL latch can cease when XFER is de-asserted. From step S390, program flow can proceed to step S395 where the scan mode program can cease.

Figure 4:
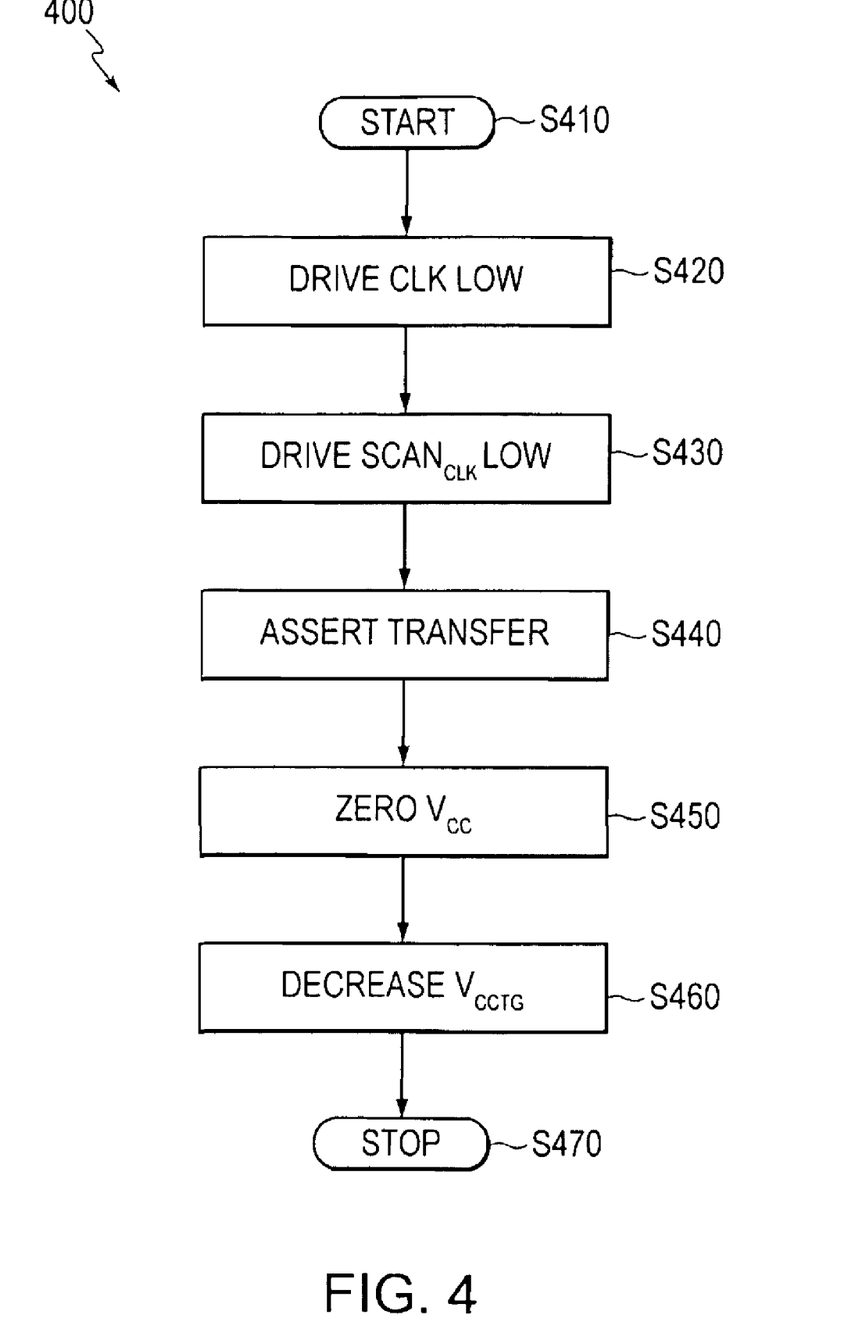
FIG. 4 is a flowchart of an exemplary method for entering the standby mode of a state-retentive scan latch.

FIG. 4 is a flowchart of an exemplary method 400 for entering the standby mode of a state-retentive scan latch. The method 400 can start at step S410 and can proceed to step S420 in which a CLK signal may be driven low. The low CLK signal can pre-condition a state-retentive latch for standby mode. From step S420, the method 400 can proceed to step S430 in which a shift-enable signal, denoted $SCAN_{CLK}$ can be driven low. The low $SCAN_{CLK}$ signal can pre-condition the state-retentive latch for standby mode, either in conjunction with the low CLK signal or independently.

From step S430, program flow can continue to step S440 in which a state retention signal can be asserted. The active-to-low signal can retain the state of the high performance (HP) memory or de-powerable memory element. A state retention signal can be denoted XFER. The state retention signal can be a logical OR of an active-to-low command and an external SCLK clock signal or the state retention signal can be the active-to-low signal. The SCLK signal can be used to output scan data in a scan mode. The SCLK signal can be an output clock signal that does not overlap the $SCAN_{CLK}$ signal during scan mode. The state retention or XFER command can be asserted to transfer data from a high performance memory to a low leakage (LL) or retention latch when a state-retentive scan latch, such as state-retentive scan latch 100, enters a standby, de-powered, or powered-down mode.

From step S440, the program flow can continue to step S450 in which a supply voltage, denoted $V_{CC}$, can be zeroed or significantly reduced. Active devices that are connected to $V_{CC}$ can be de-powered when $V_{CC}$ is zeroed or significantly reduced. The $V_{CC}$ power supply level may be drained toward zero by leakage currents when, for example, a connection between an HP memory and a power supply is switched to high impedance state.

After step S450, the program flow can continue to step S460 in which a voltage that supplies an LL latch, denoted $V_{CCTG}$, may optionally be decreased. In other words, there can be two ways of reducing overall power consumption in a state retentive latch, such as the state-retentive latch 100. First, de-powering the high performance or thin gate oxide transistors may reduce the power consumption during a standby mode. Second, decreasing, but not zeroing, the voltage, VCCTG, of the power supply to an LL latch, may produce an optional, additional power savings. The amount by which $V_{CCTG}$ may be decreased can be a function of the gate oxide thickness, standby mode lifetime requirements, reliability requirements, ambient temperature, response time requirements, and other factors.

From program step S460, the program may proceed to step S470 in which the standby entry program flow may end.

Figure 5:
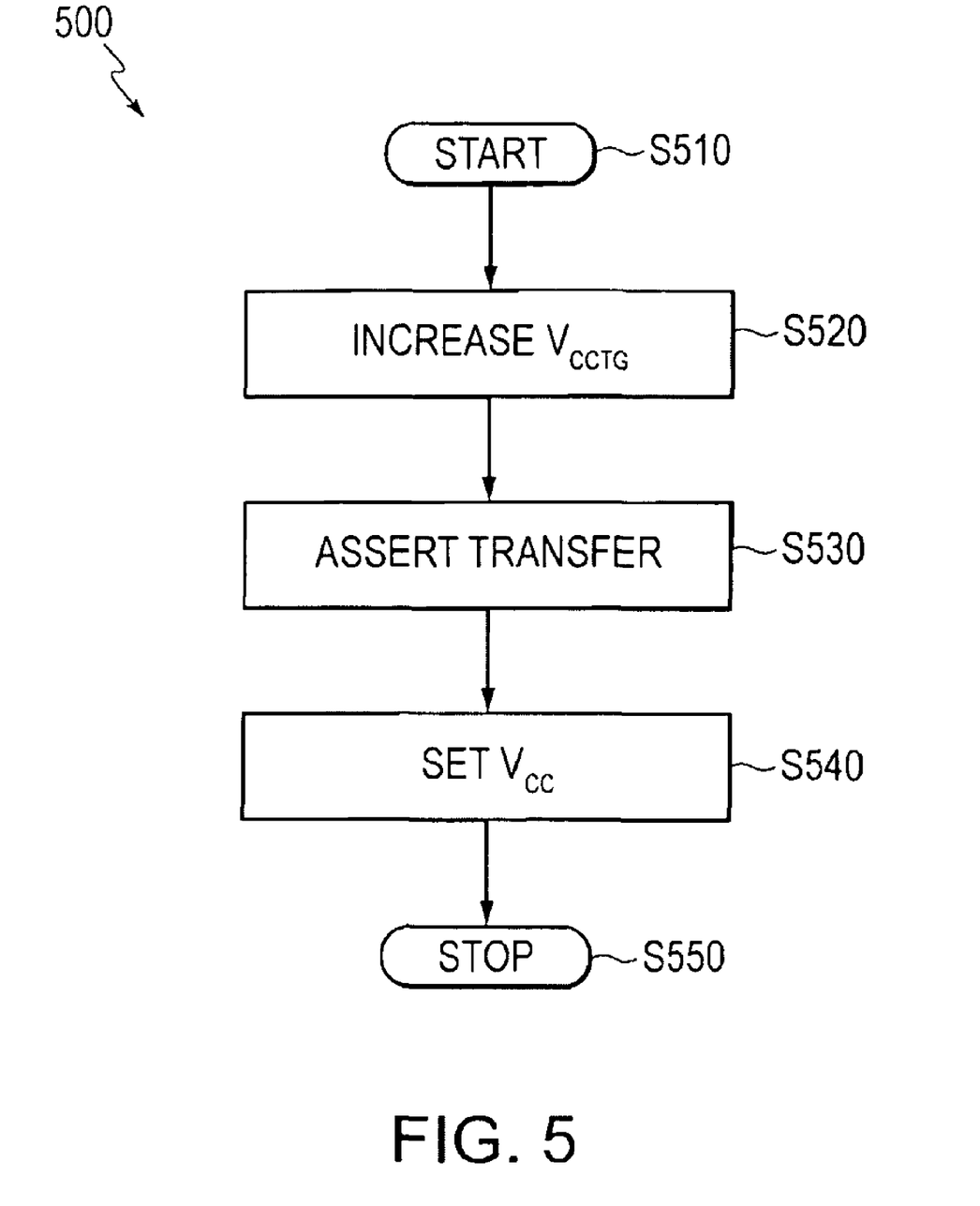
FIG. 5 is a flowchart of an exemplary method for exiting the standby mode of a state-retentive scan latch.

FIG. 5 is a flowchart of an exemplary method 500 for exiting the standby mode of a state-retentive scan latch, such as state-retentive latch 100. The method or process can start at step S510 and program flow can continue to step S520 in which a power supply voltage, $V_{CCTG}$, to an LL latch can be increased. As noted in the discussion of step S460 of method 400, the decrease of the LL latch power supply voltage, $V_{CCTG}$, when entering the standby mode and a corresponding increase in step S520 when exiting the standby mode, may be optional. As a further option, when exiting the standby mode, the low leakage latch power supply voltage may be increased above the level used before entering the standby mode. Increases and decreases in the low leakage latch power supply voltage may be determined by response time, reliability, ambient temperature, and other factors. Transient or dynamic changes in $V_{CCTG}$ during power-up or return from standby may be used to enhance speed and reliability of state restoration to a high performance memory, such as the pulse memory 111 or the HP memory 210.

From step S520, program flow can proceed to step S530 in which a state retention control clock XFER can be asserted. The XFER signal can be the active-to-low signal or a logical combination of an active-to-low power and a serial scan clock signal that does not overlap in time with the $SCAN_{CLK}$ signal. The logical combination can be a logical OR so that XFER is asserted and a signal transfer occurs when either the active-to-low power signal is asserted or the non-overlapping serial scan clock signal is asserted or both.

When XFER is asserted, and the power supply voltage to the high performance section $V_{CC}$ is zeroed, substantially reduced, or powered-down, then the drive levels of a LL latch, such as LL latch 234, can determine the state of a de-powered HP memory, such as HP memory 210.

From program step S530, program flow can proceed to step S540, in which the power supply to the HP memory can be re-established. The power supply can be established by ramping up the core logic power supply voltage, $V_{CC}$. The ramp can be a linear voltage change, a step with a finite rise time, a response of a first-order or second order lowpass system to a step, and the like. In step S540, the LL latch can write-back to the HP memory or overwrite the state of the HP memory so that the HP memory can be said to copy or replicate the state of the LL latch. From program step S540, program flow can continue to step S550 in which the standby exit program flow can stop.

While the invention has been described in conjunction with the specific exemplary embodiments thereof, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A device comprising:
    a low leakage latch, across which a sustained voltage is applied; and
    a de-powerable memory element that is coupled to the low leakage latch, the de-powerable memory element configured to upload and download a volatile state of the de-powerable memory element to and from the low leakage latch based on an active-to-low signal and whether the de-powerable memory element is powered or unpowered, respectively, the sustained voltage is reduced when the de-powerable memory element is unpowered.

2. The device of claim 1, further comprising:
    a scan input circuit configured to transfer serial scan data to the de-powerable memory element based on a first scan clock signal; and
    a bi-directional pass gate configured to receive the active-to-low signal and cause the bi-directional pass gate to upload and download the volatile state when the de-powerable memory element is powered and unpowered, respectively.

3. The device of claim 2, wherein the bi-directional pass gate uploads the serial scan data when the bi-directional pass gate receives a second scan clock signal and the de-powerable memory element is powered.

4. The device of claim 3, further comprising:
    a logic gate that is coupled to the bi-directional pass gate, the logic gate being configured to transmit a transfer signal to the bi-directional pass gate based on at least one of the active-to-low signal and the second scan clock signal.

5. The device of claim 4, wherein the first scan clock signal and the second scan clock are non-overlapping.

6. The device of claim 2, wherein the scan input circuit transfers the serial scan data to the low leakage latch after the scan input circuit transfers the serial scan data to the de-powerable memory element while the de-powerable memory element is being powered.

7. The device of claim 2, the bi-directional pass gate further comprising:
    a first pass transistor coupled to an output of a feedback low leakage inverter and an input of a feed-forward low leakage inverter; and
    a second pass transistor coupled to an input of the feedback low leakage inverter and an output of the feed-forward low leakage inverter.

8. The device of claim 1, wherein the low leakage latch further comprises:
    a feed-forward low leakage inverter; and
    a feedback low leakage inverter coupled to the feed-forward low leakage inverter, such that an output of the feedback low leakage inverter is coupled to an input of the feed-forward low leakage inverter and an input of the feedback low leakage inverter is coupled to an output of the feed-forward low leakage inverter.

9. The device of claim 8, wherein the feed-forward low leakage inverter, the feedback low leakage inverter, and the bi-directional pass gate are comprised of thick gate oxide MOSFET transistors.

10. The device of claim 1, further comprising:
    a serial inverter that outputs a state of the low leakage latch.

11. The device of claim 1, wherein the sustained voltage is between 5 and 0 Volts.

12. The device of claim 1, further comprising:
    a transmission gate that transfers a clocked data signal to the de-powerable memory element based on a pulse clock signal when the de-powerable memory element is powered.

13. The device of claim 12, wherein the transfer gate stores the volatile state in the de-powerable memory element based on a pulse clock signal.

14. The device of claim 1, the de-powerable memory element further comprising:
    a feed-forward inverter; and
    a feedback inverter that is coupled to the feed-forward inverter such that an output of the feedback inverter is coupled to an input of the feed-forward inverter and an input of the feedback inverter is coupled to an output of the feed-forward inverter.

15. The device of claim 14, wherein the feedback inverter receives a clocked data signal when gated by a pulse clock signal.

16. A method comprising:
    applying a sustained voltage across a low leakage latch;
    uploading a volatile state of a de-powerable memory element to the low leakage latch based on an active-to-low signal while the de-powerable memory element is powered; and
    downloading the volatile state from the low leakage latch to the de-powerable memory element based on the active-to-low signal while the de-powerable memory element is un-powered,
    wherein the sustained voltage is reduced when the de-powerable memory element is unpowered.

17. The method of claim 16, further comprising:
    transferring a serial scan data to the de-powerable memory element based on a first scan clock signal.

18. The method of claim 17, further comprising:
    uploading the serial scan data based on a second scan clock signal when the de-powerable memory element is powered.

19. The method of claim 18, further comprising:
    generating a transfer signal based on at least one of the active-to-low signal and the second scan clock signal.

20. The method of claim 19, wherein the first scan clock signal and the second scan clock are non-overlapping.

21. The method of claim 16, wherein the sustained voltage is between 5 and 0 Volts.

22. The method of claim 16, further comprising:
    transferring a clocked data signal to the de-powerable memory element based on a pulse clock signal when the de-powerable memory element is powered.

23. A method of retaining a serial scan data, comprising:
    storing serial scan data in a volatile location to form a volatile state based on a scan clock;
    storing the volatile state in a nonvolatile location to form a nonvolatile state based on an active-to-low signal;
    de-powering the volatile location;
    reducing a sustained voltage of the nonvolatile location;
    initializing the de-powered volatile location with the nonvolatile state based on a transfer signal; and
    re-powering the volatile location.

* * * * *